(12) United States Patent
Rebstock

(10) Patent No.: US 10,770,323 B2
(45) Date of Patent: Sep. 8, 2020

(54) STACKABLE SUBSTRATE CARRIERS

(75) Inventor: Lutz Rebstock, Gaienhofen (DE)

(73) Assignee: Brooks Automation GmbH (DE)

( * ) Notice: Subject to any disclaimer, the term of this patent is extended or adjusted under 35 U.S.C. 154(b) by 1641 days.

(21) Appl. No.: 13/028,180

(22) Filed: Feb. 15, 2011

(65) Prior Publication Data

US 2011/0198256 A1 Aug. 18, 2011

Related U.S. Application Data

(60) Provisional application No. 61/305,567, filed on Feb. 18, 2010.

(51) Int. Cl.
 B65D 1/36 (2006.01)
 H01L 21/673 (2006.01)

(52) U.S. Cl.
 CPC .. H01L 21/67326 (2013.01); H01L 21/67313 (2013.01)

(58) Field of Classification Search
 CPC ........ H01L 21/67326; H01L 21/67313; B65D 21/0201; B65D 21/0204; B65D 25/107; B65D 81/361
 USPC .............. 220/23.4, 23.2, 6, 628, 23.83, 533; 206/504, 723
 See application file for complete search history.

(56) References Cited

U.S. PATENT DOCUMENTS

| | | | | |
|---|---|---|---|---|
| 3,338,452 A | * | 8/1967 | Oakley | H01M 2/0245 220/23.4 |
| 3,701,079 A | * | 10/1972 | Bowden | H01R 13/514 206/509 |
| 4,410,094 A | * | 10/1983 | Wagar | 211/55 |
| 4,577,914 A | * | 3/1986 | Stravitz | G11B 33/04 206/387.14 |
| 5,088,619 A | * | 2/1992 | Shank | 220/532 |
| 5,996,805 A | | 12/1999 | Evers | |
| 2016/0141141 A1 | | 5/2016 | Ohashi et al. | |

FOREIGN PATENT DOCUMENTS

| | | | |
|---|---|---|---|
| CN | 2462759 | * 12/2001 | ............. A47B 57/10 |
| CN | 201148275 | 11/2008 | |
| JP | 61044425 | 3/1986 | |
| JP | 8330378 | 12/1996 | |
| JP | 6224938 | 11/2017 | |

OTHER PUBLICATIONS

PCT preliminary report on patentability-PCT/IB2011/050659-dated Aug. 21, 2012.

* cited by examiner

*Primary Examiner* — Elizabeth J Volz
(74) *Attorney, Agent, or Firm* — Perman & Green; Colin C. Durham

(57) ABSTRACT

In an embodiment, the present invention discloses a stackable substrate carrier for scalably storing, transporting or processing multiple substrates. The present substrate carriers can be stacked side-by-side by an attaching mechanism, forming an integrated carrier with double, triple or multiple capacity. The attaching mechanism comprises a locking mechanism to secure the substrate carriers together, engaged by mating two substrate carriers, together with an additional rotating or translating action of the two substrate carriers. Alternatively, the locking mechanism can be engaged by pressing two substrate carriers against each other, using friction to keep the carriers together. Other locking mechanism can also be used, such as hooks or latches.

20 Claims, 15 Drawing Sheets

STACKABLE SUBSTRATE CARRIERS

This application claims priority from U.S. Provisional Patent Application Ser. No. 61/305,567, filed on Feb. 18, 2010, entitled "Stackable substrate carriers"; which is incorporated herein by reference.

BACKGROUND

In the process of manufacturing semiconductor devices, LCD panels, and others, there are hundreds of types of processing equipment for processing semiconductor substrates. A substrate carrier is typically used to hold a plurality of substrates to be carried between the processing equipment. In a single wafer process equipment, the substrates in the carrier are individually and sequentially picked up by a multi joint robot, and then moves through the semiconductor manufacturing process. In a batch process equipment, multiple substrates are processed at the same time, with or without the substrate carrier. The input stations for the processing equipment are standardized, designed for one specific design or a number of hybrid designs of substrate carriers. For example, a typical substrate carrier is designed to handle 25 substrates.

The fixed number of substrates in a substrate carrier is not desirable in certain cases. For example, sometimes only a few special substrates need to be processed, leaving the substrate carriers more than half empty. Sometimes a large number of substrates need to have the same process condition, but have to be separated to multiple carriers to be processed separately because of the limitation of number of substrates per carrier.

SUMMARY

In an embodiment, the present invention discloses a stackable substrate carrier, for example, for scalably storing, transporting or processing multiple substrates. The present substrate carriers can be stacked side-by-side by an attaching mechanism, forming an integrated carrier with double, triple or multiple capacity.

In an embodiment, the present stackable substrate carrier comprises an opening for substrate input and output, support elements for holding a plurality of substrates within the substrate carrier, and at least an end wall having an attaching mechanism for mating with another substrate carrier. The attaching mechanism can be rotatably mated, so that a substrate carrier rotates for mating with another substrate carrier. In an aspect, a substrate carrier rotates 180 degrees, and the two end sides having the attaching mechanism can be mated to form an integrated carrier. The attaching mechanism can be linearly mated, so that a substrate carrier translates for mating with another substrate carrier. The attaching mechanism can be on one or more sides of the substrate carrier, allowing 1 dimensional (D), 2D or even 3D stackability.

In an embodiment, the attaching mechanism comprises a mating or locking mechanism to secure the substrate carriers together. The locking mechanism can be engaged by mating two substrate carriers, together with an additional rotating or translating action of the two substrate carriers. Alternatively, the locking mechanism can be engaged by pressing two substrate carriers against each other, using friction to keep the carriers together. Other locking mechanisms can also be used, such as hooks or latches. The locking mechanism can also comprise semi-permanent securing mechanisms such as screws or adhesives.

In an embodiment, the present stackable substrate carrier comprises two opposite front and back end structures holding a plurality of side structures for holding the substrates. The side structures can comprise a plurality of rods with teeth where the substrates are disposed in the grooves created by the teeth. A plurality of rods can be used, with some rods supporting the sides and some rods supporting the bottom of the substrates. The side structures can comprise a plurality of plates with grooves. Two side plates can be used to hold the substrates. A bottom plate, with or without the grooves, can be included to support the substrates. The groove plates can be planar plates, or L shape plates to support two sides of the substrates.

In an embodiment, the present stackable substrate carrier is designed for a solar wafer carrier, for example, square monocrystalline or polycrystalline wafers. The present stacked substrate carriers can simplify the storage, transport or processing of solar wafers, by stacking an appropriate number of carriers.

DETAILED DESCRIPTION OF THE PREFERRED EMBODIMENTS

Substrate carriers are typically utilized for transporting or storing semiconductor substrates, such as silicon wafers, solar cell wafers or magnetic disks. For example, the processing of solar cell wafers into solar cells often involves several steps where the disks are repeatedly processed, stored and transported. The substrate carriers can also be utilized in supporting the substrates during processing, such as holding the substrates in a wet bath cleaning or coating process.

In an embodiment, the present invention discloses stackable substrate carriers which can be stacked to form integrated carriers with higher substrate storage capacity. For example, two stackable substrate carriers can be stacked together to form an integrated substrate carrier with double the substrate holding capacity. Preferably, the stackable substrate carriers are identical for ease of carrier manufacturing and stacking. However, the substrate carriers can only have identical end structures for ease of stacking, and different or same side structures to hold different or same number of substrates, respectively.

Figure 1A:
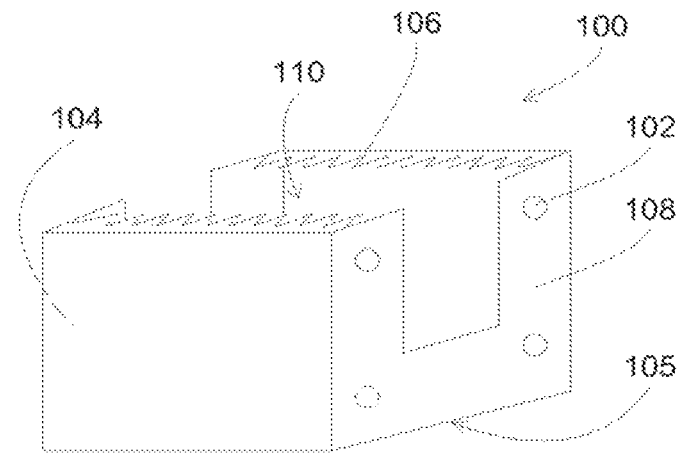
FIG. 1A illustrates an exemplary embodiment of the present stackable substrate carrier.
Figure 1B:
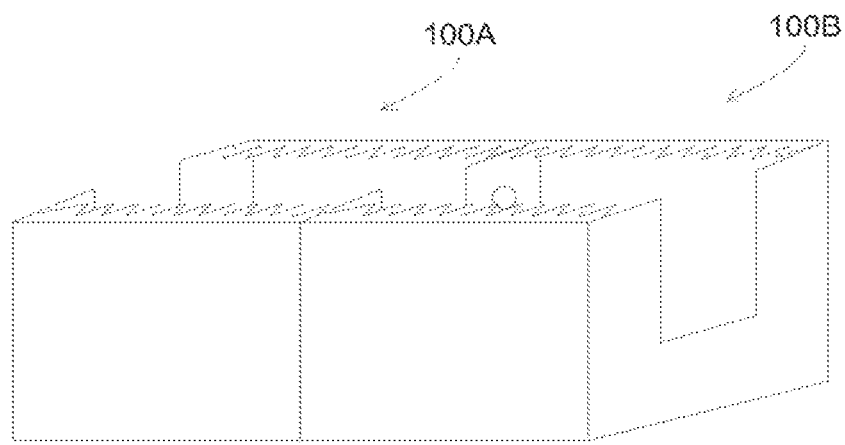
FIG. 1B illustrates an exemplary embodiment of two stackable substrate carriers stacked together to form an integrated carrier.

FIG. 1A illustrates an exemplary embodiment of the present stackable substrate carrier, which is a side-by-side stackable carrier 100, comprising an opening 110 for bringing in or for taking out substrates, side structure 104 having slot marks or grooves 106 for holding a plurality of substrates, and at least a front end (or back end) structure 108 having an attaching or mating mechanism 102 for mating with another substrate carrier. The carrier 100 can also comprise a bottom structure 105, which can be a separate element from the side structure 104 or can be an integrated portion of the side structure 104. FIG. 1B illustrates an exemplary embodiment of two side-by-side stackable substrate carriers 100A and 100B stacked together to form an integrated carrier or a side-stacked composite carrier.

Carriers are generally configured to axially arrange the substrates in slots, for example, in grooves 106, and to support the substrates by or near their peripheral edges. The substrates are conventionally removable from the carriers in a radial direction upwardly or laterally, for example, by opening 110. Visibility of substrates is desirable, and thus the front end structure 108 can be configured in U shape or O shape with an opening in the middle of the end structure. Further, the opening in the end structure 108 can allow chemical flow between carriers in a stacked composite carrier. The dimensions of the carriers are designed to provide stability to prevent damage to the substrates and to minimize movement of the substrates within the carrier. The tolerances of the slots holding substrates are typically small to reduce movements.

The carrier material can be chosen to maintain its stability, for example, under elevated temperatures. In addition, the carrier materials have minimal outgassing of volatile components, and are selected to have minimum charge built up, for example, by using materials with static dissipation characteristics. The carrier materials can also be selected to minimize metal contamination, and are chemically compatible to any exposed chemicals, for example, cleaning solutions and solvents such as isopropyl alcohol, and process solutions such as acids and other harsh chemicals.

In an embodiment, the carrier materials are formed from injection molded plastics such as polycarbonate (PC), acrylonitrile butadiene styrene (ABS), polypropylene (PP), polyethylene (PE), perfluoroalkoxy (PFA), and polyetheretherketone (PEEK). Fillers which have been added to injection molded plastics for static dissipation include but are not limited to carbon powder or fiber, metal fibers, metal coated graphite, and organic (amine-based) additives.

In an embodiment, the substrate carrier is formed from a single molded part comprising a front end having an attaching mechanism, a back end having or not having a second attaching mechanism, and sidewalls having grooves or slots, a bottom wall having or not having grooves or slots, and an open top for substrate input/output.

In an embodiment, the substrate carrier is formed by assembling different sections such as the side structures, the front end, back end, and bottom structure. Different parts of the carrier might be formed from different materials, for example, PEEK is a more expensive material that has ideal abrasion resistance characteristics ideal for substrate contact portions such as the grooves or slots, but is difficult to mold.

Figure 2A:
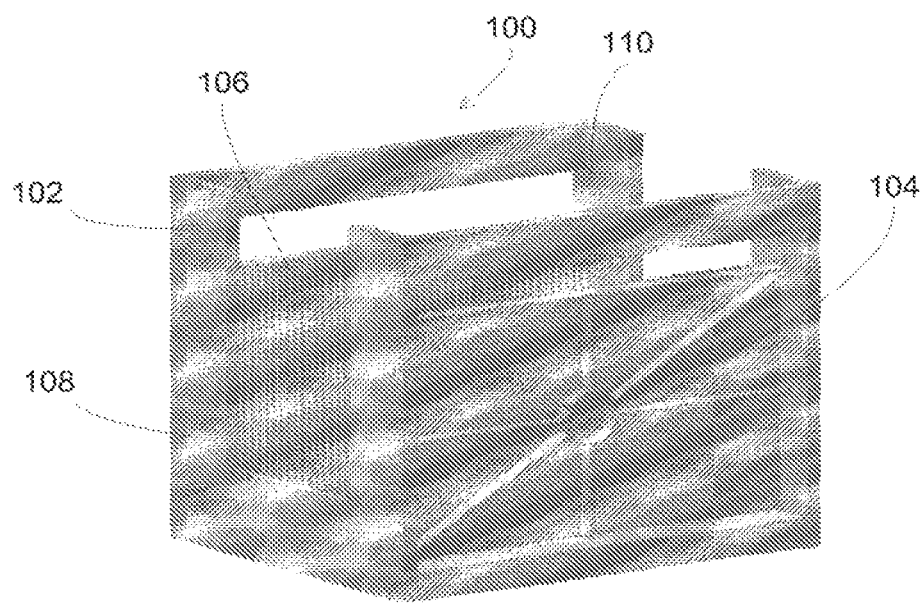
FIGS. 2A and 2B illustrate another exemplary embodiment of the present stackable substrate carrier and an integrated carrier formed from two stackable carriers.
Figure 2B:
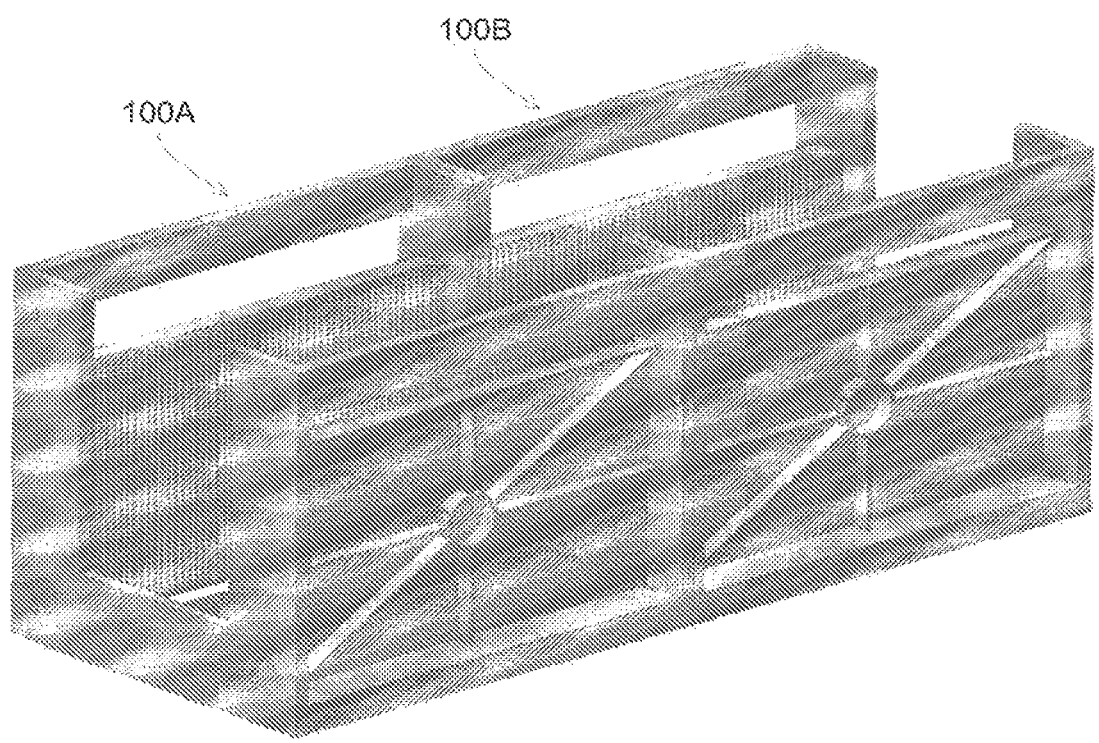

FIGS. 2A and 2B illustrate another exemplary embodiment of the present stackable substrate carrier and an integrated carrier formed from two stackable carriers. The sidewall support element 104 has reinforced bars for additional structural stability.

In an embodiment, the present substrate carriers are designed for square wafers, such as polycrystalline wafers for solar cell applications. The sidewalls 104 and the bottom wall form a squared U shape for holding square substrates.

FIG. 2B shows an integrated carrier formed from two stackable carriers having the same size, e.g., same substrate carrying capacity. In an embodiment, stackable carriers with different substrate carrying capacities can be used to form integrated carriers. By changing the side structures of the stackable carriers, different number of substrates can be stored in the carriers. Further, the front and end structures can be the same or can be different.

Figure 3A:
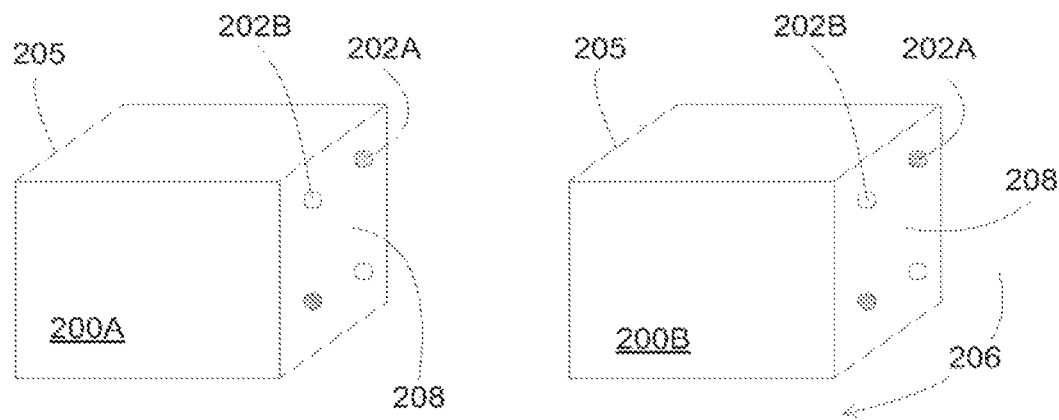
FIGS. 3A-3E illustrate an exemplary process of stacking stackable substrate carriers to form an integrated carrier.
Figure 3B:
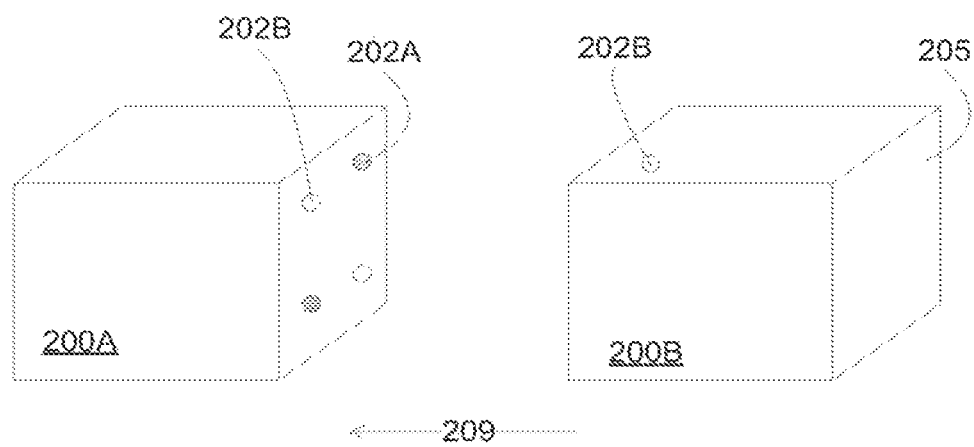
Figure 3C:
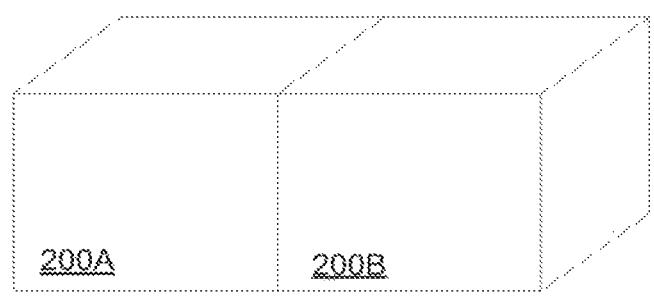

FIGS. 3A-3C illustrate an exemplary process of stacking two stackable substrate carriers to form an integrated carrier. FIG. 3A illustrates substrate carriers 200A and 200B each having opposite walls 208 and 205. The opposite walls 208 and 205 can be a front end and a back end, or alternatively, the opposite walls 208 and 205 can be two opposite sidewalls. As shown, the wall 208 comprises attaching or mating mechanism 202A and 202B, which are identical for both carriers 200A and 200B. Other walls, such as wall 205, do not have any attaching mechanism, or have similar mechanism or different mechanism. In an embodiment, only wall 208 has an attaching mechanism 202A and 202B, which are identical for all substrate carriers 200A and 200B. Substrate carrier 200B rotates 206, for example, 180 degrees, so that the wall 208 of carrier 200B is facing the same wall 208 of carrier 200A.

FIG. 3B illustrates substrate carriers 200A and 200B having wall 208 with attaching mechanism 202A/202B facing each other. The substrates carriers are then brought together linearly for mating the attaching mechanisms, resulting in an integrated carrier (FIG. 3C), comprising carriers 200A and 200B.

In an embodiment, wall 208 has attaching mechanism 202A/202B and wall 205 does not. Each carrier can have identical attaching mechanisms 202A/202B, designed to be mated with each other after a rotating action. For example, attaching mechanism 202A can be a male portion and attaching mechanism 202B can be a female portion, which after rotation, are facing each other and can be mated together. In this case, all substrate carriers are identical, and any two substrate carriers can be mated with each other. If the attaching mechanism is only formed on one wall, then the integrated carrier is only composed of two stackable carriers. If the opposite wall 205 also has an attaching mechanism, either similar or different than the attaching mechanism 202A/202B of wall 208, then additional carriers can be mated to the integrated carrier. If the wall 205 has same attaching mechanism 202A/202B, then carrier 200A can be stacked side-by-side with carrier 200B at either wall 205 or 208.

In an embodiment, the attaching mechanism is matingly symmetric, e.g., each mating part having a corresponding mated part located at the symmetric locations. For example, the attaching mechanism can be vertically mirror symmetric with respect to a vertical center line dividing the end structure. This vertically mirror symmetric can enable one end structure to be rotated (for example, 0, 90, 180, or 270 degrees) to be mated with another end structure having the same attaching mechanism.

Figure 3D:
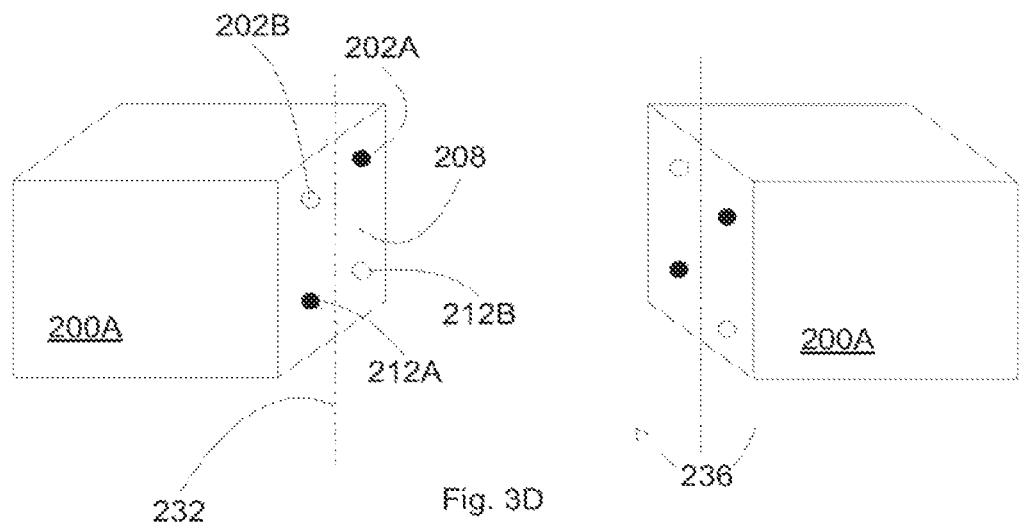
Figure 3E:
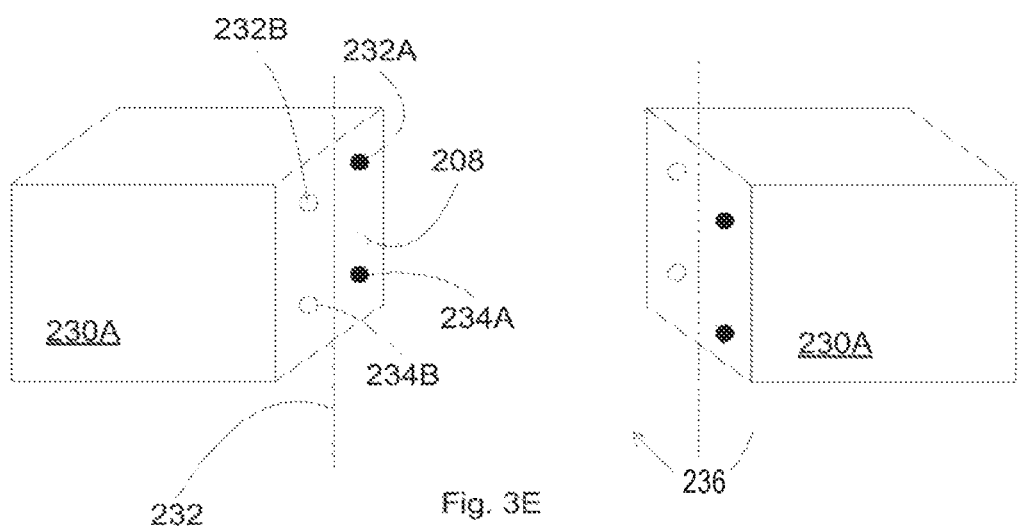

FIGS. 3D-3E illustrate exemplary embodiments of the symmetry for the end structures according to an embodiment of the present invention. In FIG. 3D, stackable carrier 200A shows a sidewall 208, which can be an end structure, or a side structure of the carrier 200A. The sidewall 208 comprises an attachment mechanism, such as mating element 202A and corresponding mated element 202B. Mating element 202A and mated element 202B can be mated together to form a secure attachment, for example, mating element 202A can be a male connector corresponding to a female connector 202B. The mating and mated elements 202A and 202B are mirror symmetrical with respect to a symmetric line 232, which is vertical and at the center of sidewall 208. The symmetric line 232 can be viewed as an axis of rotation, enabling the sidewall 208 to be rotated an appropriate angle to be mated to another sidewall 208. In the matingly symmetric configuration with respect to rotation line 232, element 202A generates a mirror symmetric mated element 202B. Similarly, element 212B generates a mirror symmetric element 212A.

FIG. 3E illustrates another symmetric configuration for the sidewall 208, comprising elements 232A and 234A having mirror symmetric mated elements 232B and 234B, respectively.

Figure 4A:
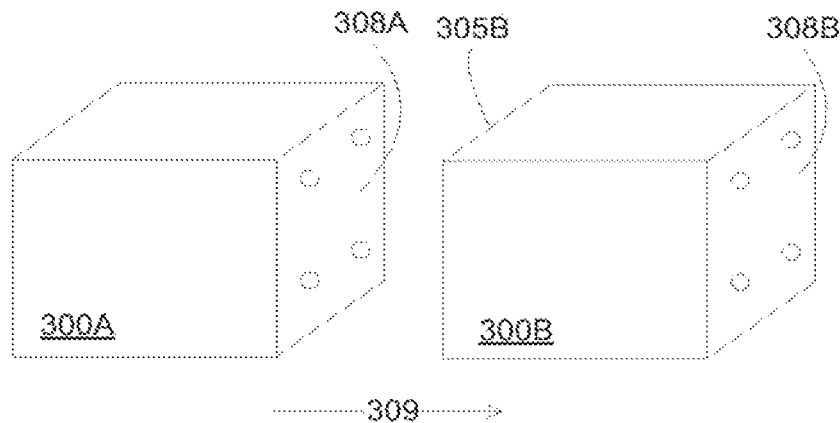
FIGS. 4A-4C illustrate another exemplary process of stacking stackable substrate carriers to form an integrated carrier.
Figure 4B:
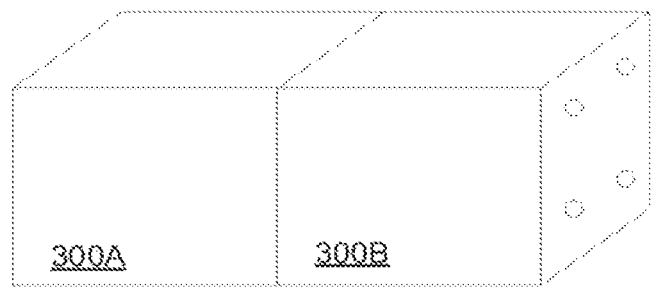
Figure 4C:
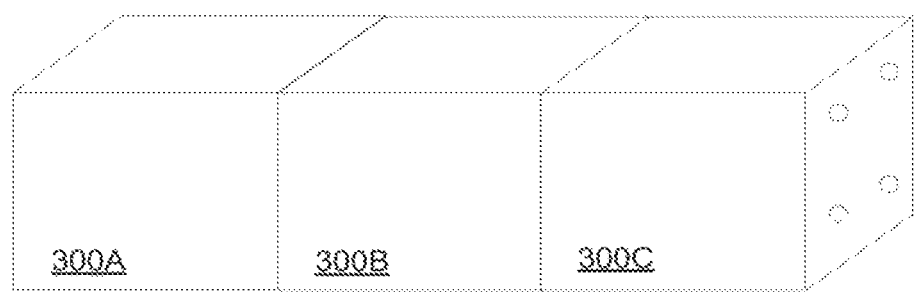

FIGS. 4A-4C illustrate another exemplary process of stacking stackable substrate carriers to form an integrated carrier. FIG. 4A illustrates two substrate carriers 300A/300B disposed side by side. The substrate carriers, for example, substrate carrier 300B, have opposite walls 305B and 308B. The substrate carriers are arranged with walls having an attaching mechanism facing each other, and after moving 309 together, forming an integrated carrier with two attached stackable carriers (FIG. 4B), having two times the substrate holding capability. Additional carriers can be further attached to the integrated carrier, forming an integrated carrier with larger substrate holding capability. For example, additional carrier 300C is added to integrated carrier 300A/300B to form an integrated carrier with 3 stackable carriers (FIG. 4C). Alternatively, only two substrate carriers can be attached to each other, forming an integrated carrier with double substrate holding capability.

In an embodiment, the facing walls have a matching attaching mechanism. For example, wall 308A/308B of carrier 300A/300B is facing wall 305B/305C of carrier 300B/300C, respectively, with opposing attaching mechanism. The carriers might be identical; in that case, all carriers have opposing attaching mechanism in opposing wall. Alternatively, the carriers might be different; in that case, only facing walls have an opposing attaching mechanism.

In an embodiment, the attaching mechanism is matingly symmetric. In that case, wall 308A of carrier 300A can be attached to wall 305B or to wall 308B (or to any other walls) of carrier 300B.

Figure 5:
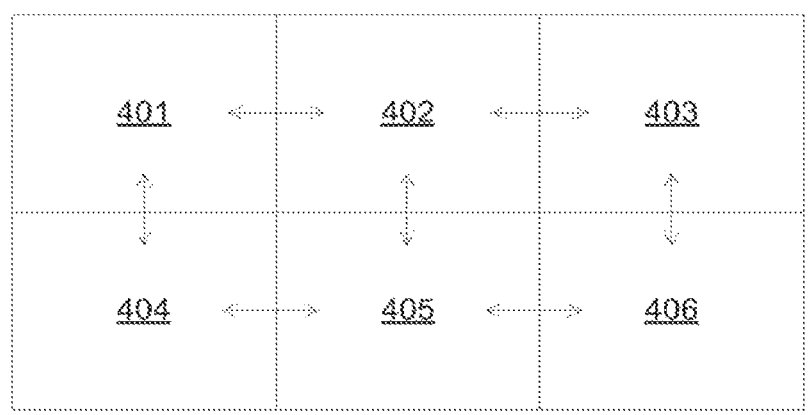
FIG. 5 illustrates another exemplary process of stacking six stackable substrate carriers to form an integrated carrier.

FIG. 5 illustrates another exemplary process of stacking six stackable substrate carriers to form an integrated carrier. As shown, six carriers 401-406 are attached side-by-side in two or three sides to form an integrated carrier. Alternatively, the carriers can be attached in two or three dimensions to extend the substrate holding capability.

Figure 6A:
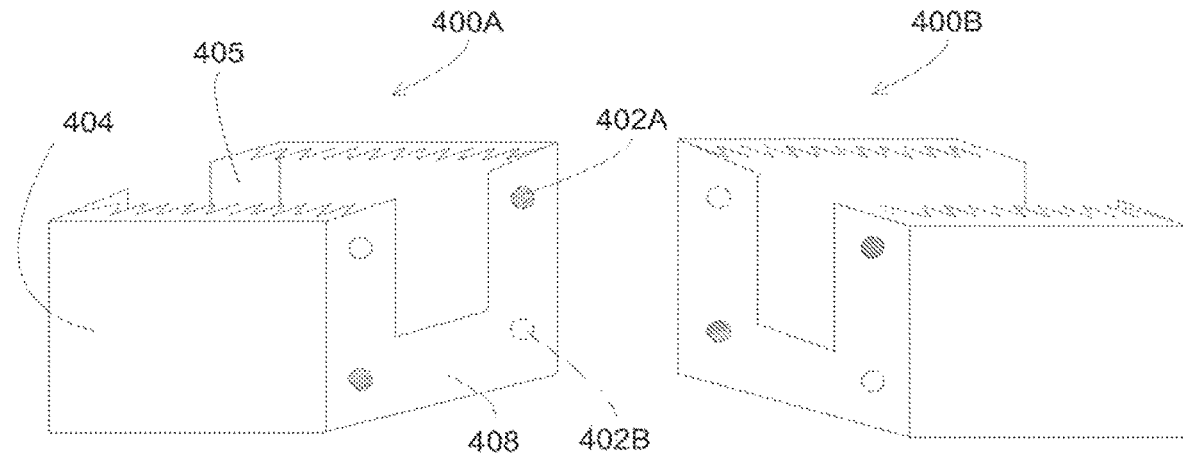
FIGS. 6A-6F illustrate an exemplary attaching mechanism for stacking two stackable substrate carriers.
Figure 6B:
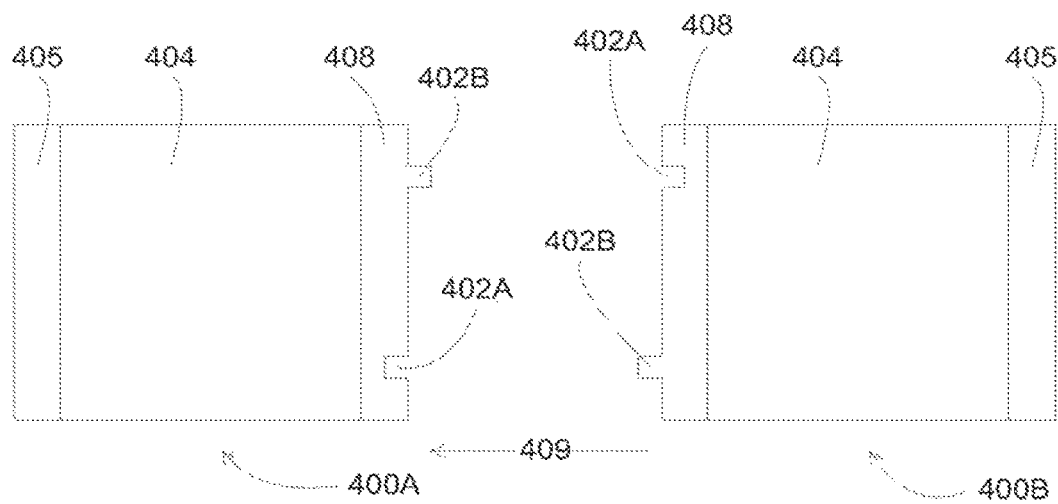

FIGS. 6A-6B illustrate an exemplary attaching mechanism for stacking two stackable substrate carriers. FIG. 6A illustrates a perspective view and FIG. 6B illustrates a cross section view of two substrate carriers 400A and 400B. The substrate carriers comprise sidewall 404 with grooves, front end 408, back end 405 and a bottom wall. The front end 408 has attaching mechanism 402A/402B which comprises a locking mechanism for locking the two substrate carriers 400A and 400B together. The locking mechanism comprises hole 402A and pin 402B, engaged by pressing together (409), using friction to keep the carriers together. As shown, the hole 402A does not penetrate through the end structure 408. In an embodiment, the hole/pin configuration is designed to be mated after rotating the carrier, thus allowing mating of identical carriers. For example, as shown, two pins/holes 402B/402A are diagonal from each others, thus mating each other when the carrier rotates at an angle, such as 180 degrees. Other configurations can be used, for example, a column of pins 402B and a column of holes 402A. The number of pin/hole can also vary.

Figure 6C:
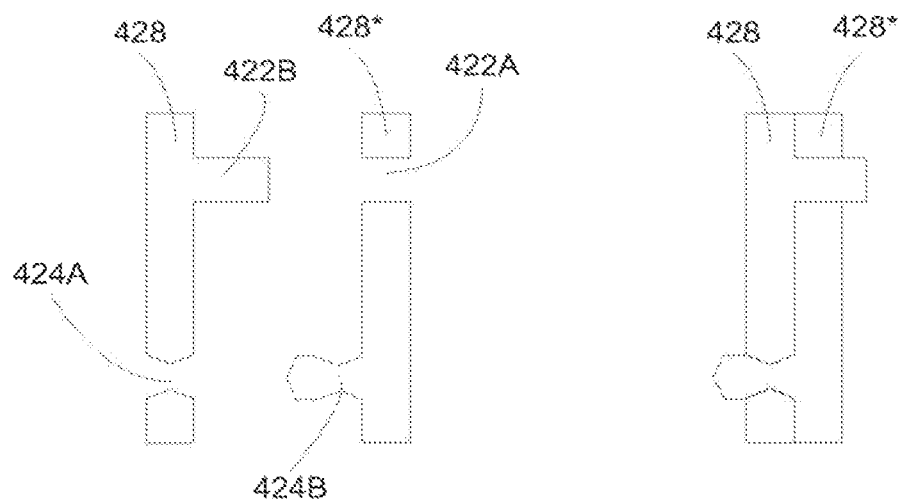

FIG. 6C illustrates an exemplary configuration of pin/hole attachment according to an embodiment of the present invention. Sidewalls 428 and 428* each comprise attachment mechanism having pins 422B/424B and holes 422A/424A. When mated, the pins 422B/424B penetrate through the sidewalls 428 and 428*. The connection can be enforced through press fitting, meaning the holes 422A/424A are slightly smaller than the pins 422B/424B. The connection can also be enforced by locking mechanism, for example, the locking mechanism of pin/hole 424B/424A, preventing the pin 424B from being released from hole 424A. The connection can also be enforced through an adhesion material, such as glue.

Figure 6D:
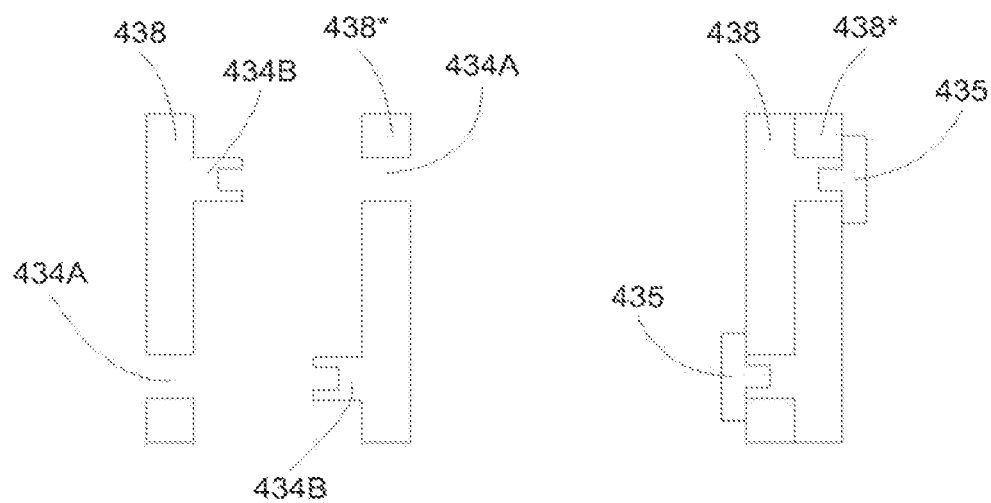

FIG. 6D illustrates another exemplary configuration of pin/hole attachment according to an embodiment of the present invention. Sidewalls 438 and 438* each comprise attachment mechanism having pins 434B and holes 434A. When mated, a lock 435 can engage the pins 434B to prevent the pin 434B from being released from hole 434A. The connection can also be enforced through an adhesion material, such as glue, or from other locking mechanism such as pin/hole 424B/424A.

Figure 6E:
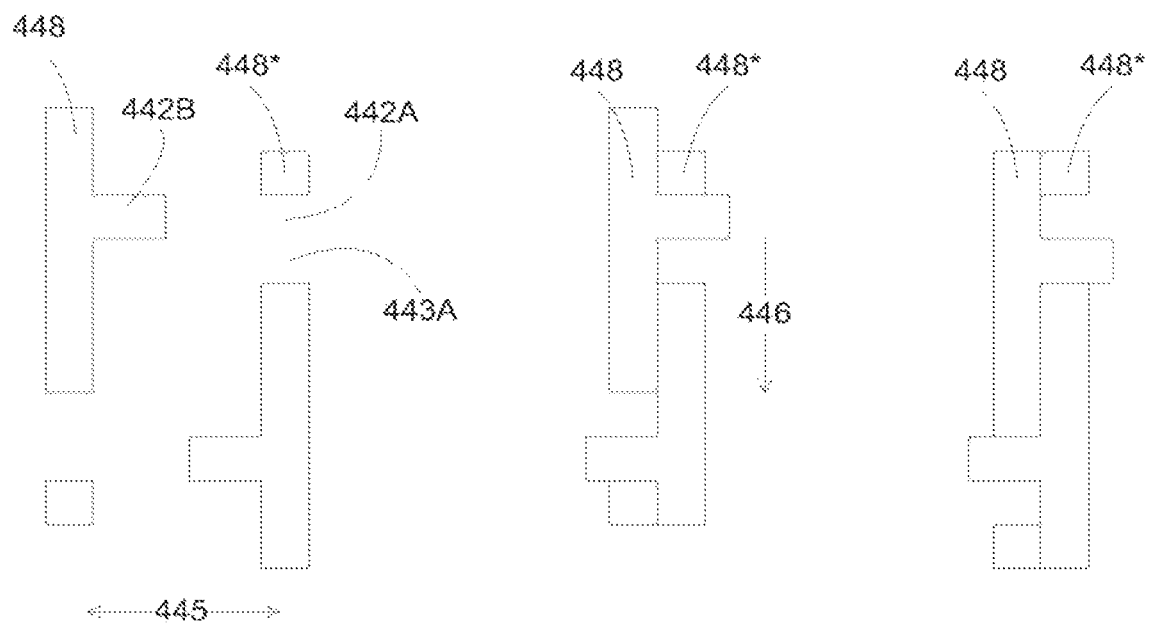
Figure 6F:
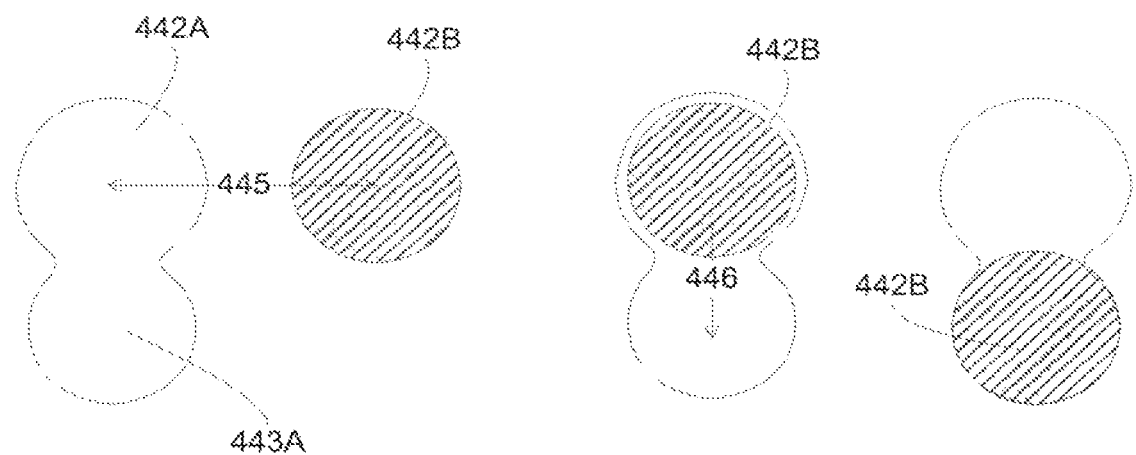

FIGS. 6E-6F illustrate another exemplary configuration of pin/hole attachment according to an embodiment of the present invention. Sidewalls 448 and 448* each comprise attachment mechanisms having pins 442B and holes 442A/443A. Hole 442A is larger than the pin 442B, served to accept the pin 442B. Hole 443A is smaller than the pin 442B, served to make a strong connection between the two sidewalls 448 and 448*. In a first movement 445, the sidewalls 448 and 448* are moving toward each other, with the pin 442B aligned with the larger hole 442A. In a second movement 446, after the two sidewalls are attached, sidewall 448 moves downward relative to sidewall 448* to engage pin 442B with hole 443A. Smaller diameter and locking notches serve to bond the pin 442B to the hole 443A.

Figure 7A:
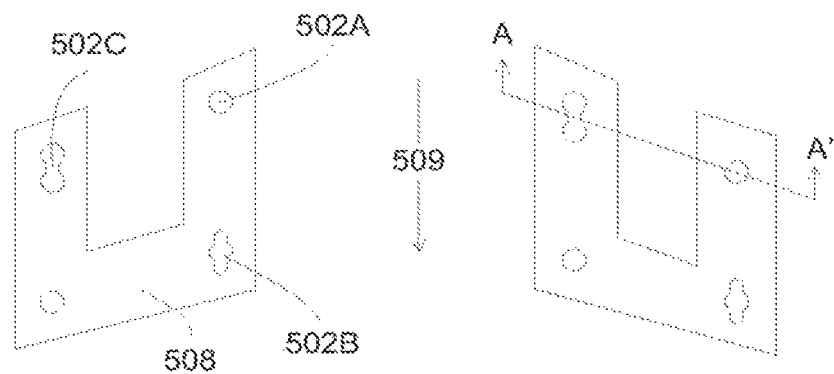
FIGS. 7A-7B illustrate another exemplary attaching mechanism for stacking two stackable substrate carriers.
Figure 7B:
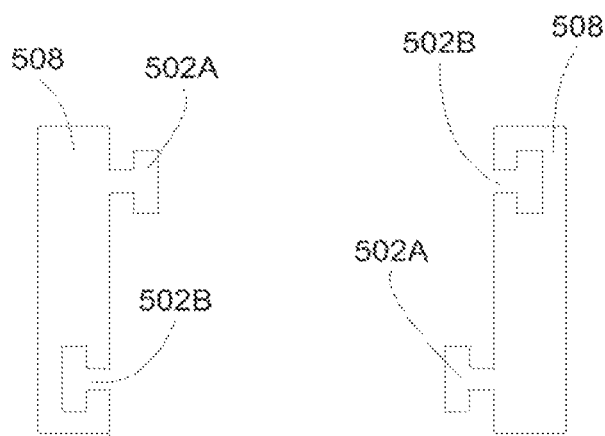

FIGS. 7A-7B illustrate another exemplary attaching mechanism for stacking two stackable substrate carriers. FIG. 7A illustrates a perspective view of the two opposite sidewalls 508 and FIG. 7B illustrates a cross section AA' view of two substrate carriers. The carriers are engaged by pushing pins 502A into slots 502B or 502C and sliding one carrier with respect to the other.

The slots are elongated slots, and can be different designs, such as 502B or 502C, designed for pin 502A to enter with a sliding action 509 for locking. Same or different slots designs can be incorporated in the sidewall 508. In an embodiment, the pin/slot configuration is matingly symmetric to accommodate the locking mechanism for identical carriers. The locking mechanism can be accomplished by rotating one carrier with respect to the other before locking engagement. Alternatively, the locking mechanism can be accomplished by linearly sliding one carrier with respect to the other before locking engagement. Other locking mechanisms can be used, such as the lock 435 for pin/hole configuration, or glue adhesive.

Figure 8:
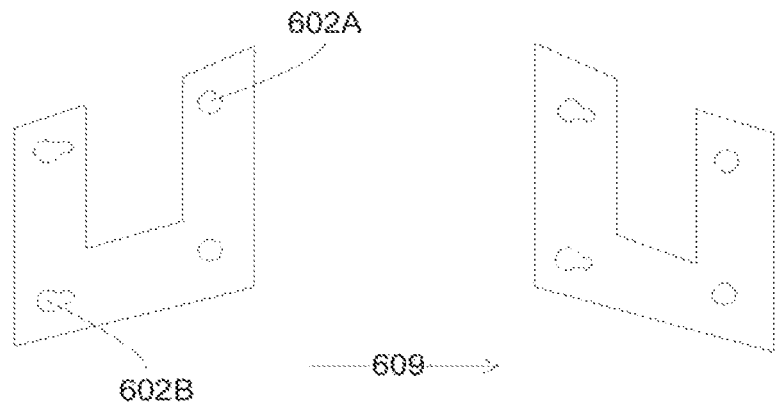
FIG. 8 illustrates another exemplary attaching mechanism for stacking two stackable substrate carriers.

FIG. 8 illustrates another exemplary attaching mechanism for stacking two stackable substrate carriers by a sliding action 609. The pin 602A can be similar to the pin 502A. Slot 602B is similar to slot 502B, but with only one extension side. Pin 602A can be pushed in the large hole of the slot 602B, and the carrier is slid 609 to lock the pin 602A into the small hole of the slot 602B.

Figure 9:
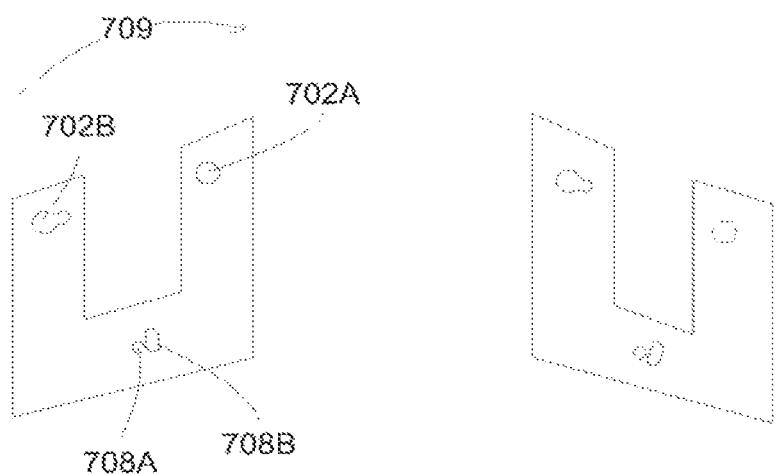
FIG. 9 illustrates another exemplary attaching mechanism for stacking two stackable substrate carriers.

FIG. 9 illustrates another exemplary attaching mechanism for stacking two stackable substrate carriers by a rotating action 709. Pin and slot 702A/702B can be similar to the pin/slot 602A/602B. Optional pin/hole combination 708A/708B can be used as rotating center for the rotating action 709. Hole 708B is elongated to accommodate the rotating action of pin 708A. These designs provide identical substrate carriers with a locking mechanism designed for engaging any two carriers. Other designs can be used, for example, for non-identical carriers.

The locking mechanisms are simply exemplary locking mechanisms. Other mechanisms can be used, such as hooks or latches. In addition, matingly symmetrical configurations are desired so that identical carriers can be used, but non-symmetrical design can also be implemented.

Figure 10A:
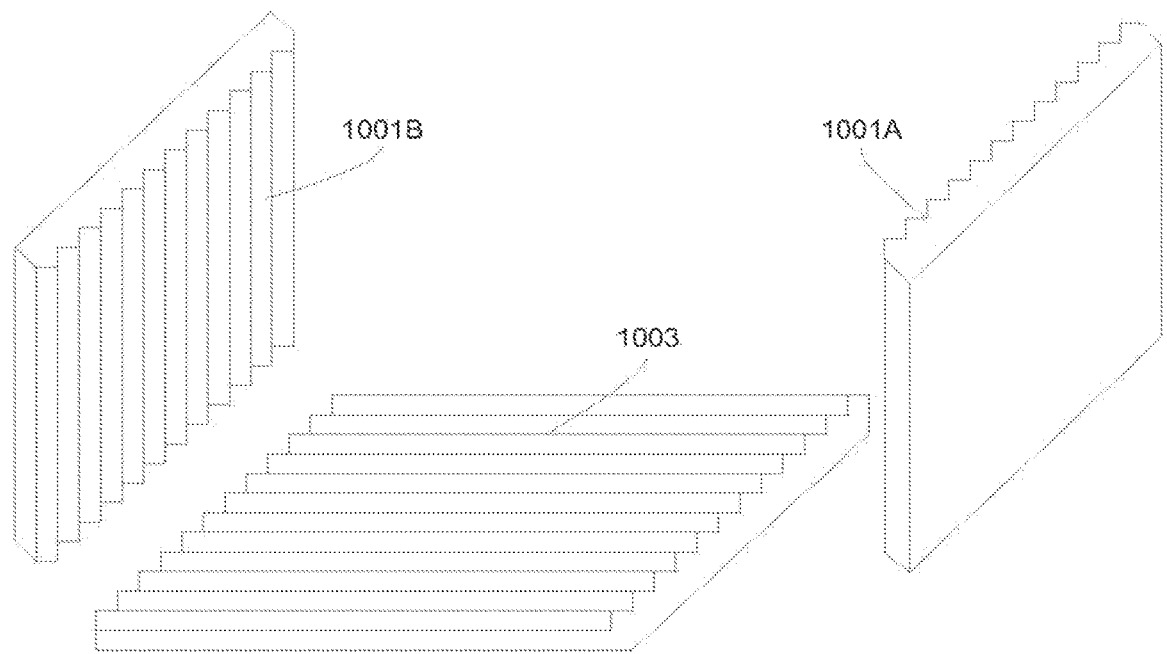
FIGS. 10A-10B illustrate exemplary components of different stackable substrate carriers.

FIG. 10A illustrates exemplary components of different stackable substrate carriers, showing sidewalls 1001A/1001B and bottom wall 1003. The sidewalls 1001A/1001B and the bottom wall 1003 have grooves for holding substrates, either integrated formed on the walls, or separately attached to the walls.

Figure 10B:
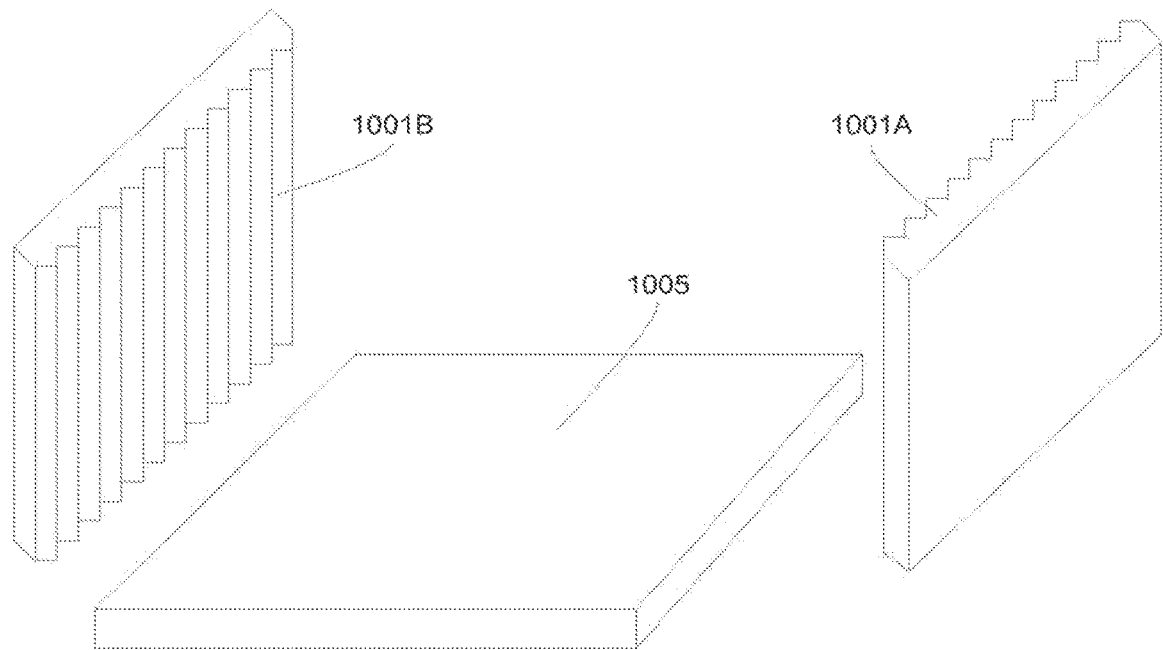

FIG. 10B illustrates other exemplary components of different stackable substrate carriers, showing sidewalls 1001A/1001B and bottom wall 1005. The sidewalls 1001A/1001B have grooves, either integrated formed on the walls, or separately attached to the walls. The bottom wall 1005 does not have any grooves.

Figure 11A:
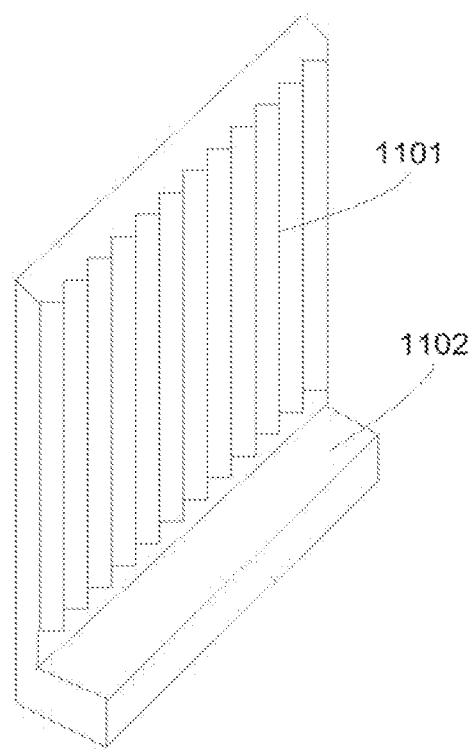
FIGS. 11A-11B illustrate other exemplary components of different stackable substrate carriers.
Figure 11B:
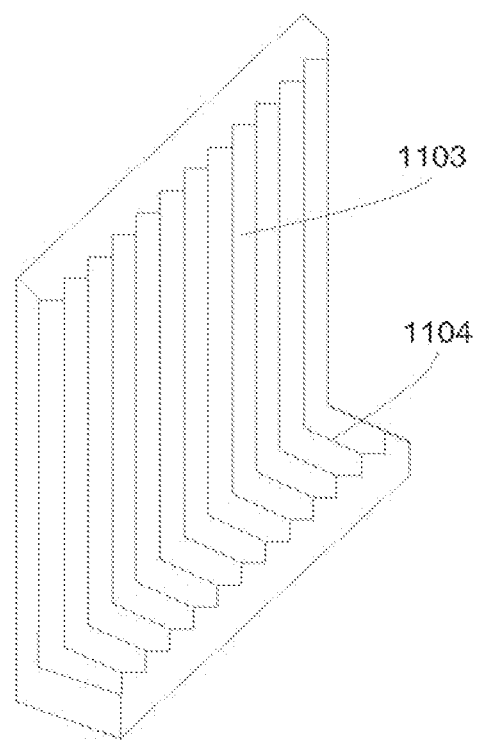

FIGS. 11A-11B illustrate two different designs for a sidewall of an exemplary substrate carrier, showing L-shape sidewalls 1101 and 1103, respectively. The bottom section 1102 of sidewall 1101 does not have any grooves while the bottom section 1104 of sidewall 1103 has grooves.

Figure 12A:
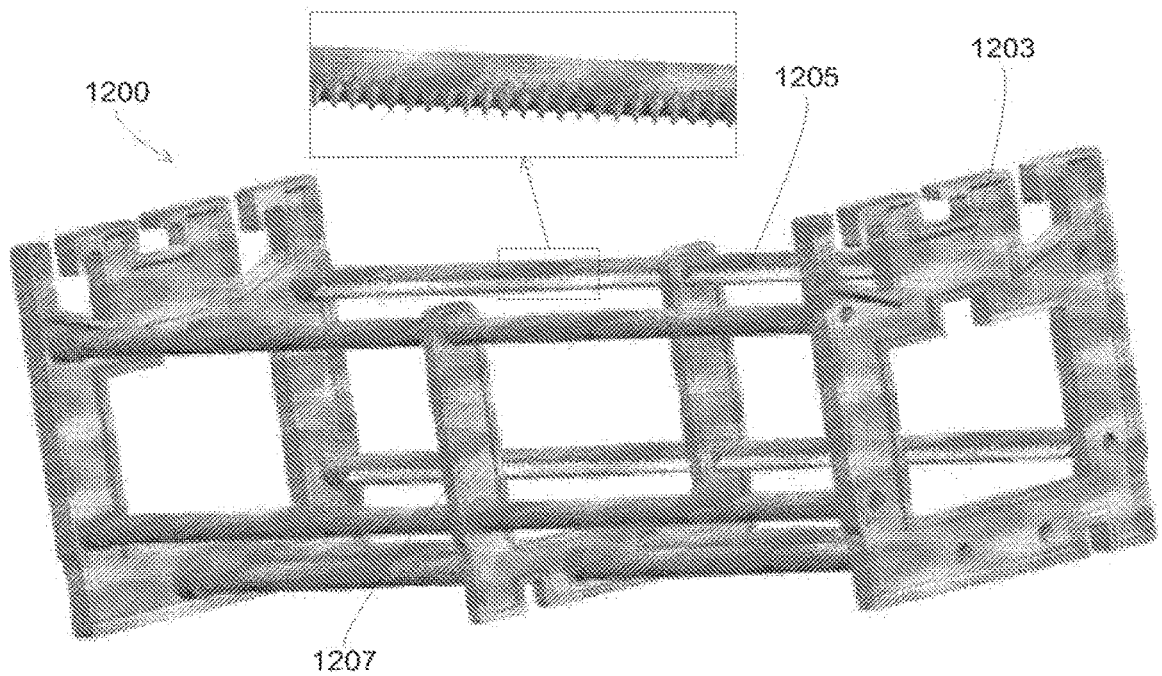
FIGS. 12A-12B illustrate another exemplary stackable substrate carrier.
Figure 12B:
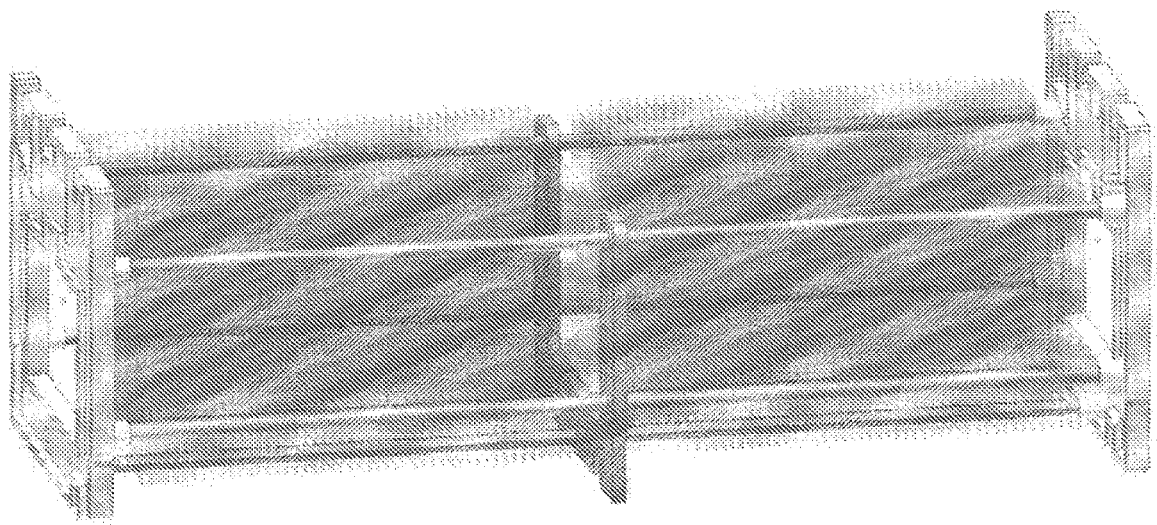

FIGS. 12A-12B illustrate another exemplary substrate carrier according to another embodiment of the present invention, without substrates and with substrates, respectively. The carrier 1200 comprises front end and back end 1203, together with slotted rods 1205. Optional middle plate 1207 can be included for structural stability.

The front end and back end 1203 has an opening in the center for observing the substrates, together with top slots for automatic transport. The front and back end 1203 has rectangular or square shape, designed to be flatly positioned on a surface. Optional attaching mechanism can be disposed on the front/back end 1203 for stacking to other substrate carriers. A U-shape middle plate 1207 can be disposed in the middle of the carrier 1200, for example, to support the rods 1205.

Rods 1205 are parallel aligned with a plurality of sawtoothed profiles, grooves, or slots with substrate contact edges. The rods 1205 comprise bottom and side support rods. The rod configuration can be designed for supporting square substrates, comprising two bottom rods and two side rods in each side. The rods, and front/back ends, are chemically resistant and can be adapted to withstand thermal cycling at high temperatures. The rods can be constructed of a fluoropolymer or can be constructed so as to have an inner core and an outer coating. The material of the inner core can be made of a fluoropolymer, ceramic, polyetherketoneketones with carbon fiber, stainless steel, and polyetheretherketones. The outer coating can be made of a fluoropolymer or can be either a suitable perfluoralkoxy or a copolymer of ethylene and chlorotrifluoroethylene.

In an embodiment, the present invention discloses methods to form integrated carriers or side-by-side stacked composite carriers by attaching or detaching individual stackable carriers.

Figure 13A:
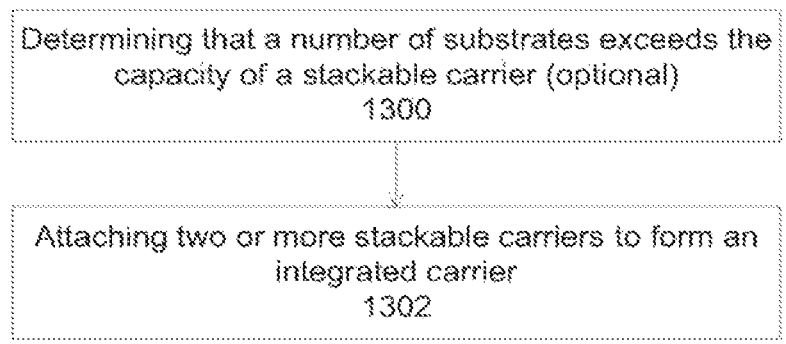
FIGS. 13A-13B illustrate exemplary flowcharts for assembling or disassembling integrated carriers.

FIG. 13A illustrates an exemplary flowchart for forming an integrated carrier. Optional operation 1300 determines that the number of substrates to be stored or supported by a carrier exceeds the capacity of the present carrier. For example, the number of substrates might exceed the capacity of an individual stackable carrier. Or the number of substrates might exceed the capacity of an integrated carrier (which already comprises a number of stackable carriers). Operation 1302 attaches a number of stackable carriers to form an integrated carrier. For example, two or more side-by-side stackable carriers can be attached together to form a side-stacked composited carrier. Alternatively, additional stackable carriers can be attached to an integrated carrier to increase its capacity.

Attaching carriers can be accomplished by press fitting two carriers together, or by matching the attachment mechanism and performing a movement to lock the carriers together. Further, coating the attachment mechanism or the carrier's surface with a glue adhesive can be used to improve connection. Also, a locking mechanism such as lock, latch, or screw can be used.

Figure 13B:
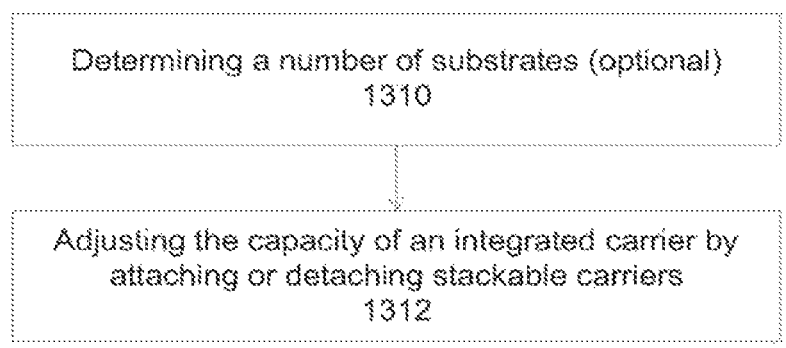

FIG. 13B illustrates another exemplary flowchart for forming a carrier. Optional operation 1310 determines a number of substrates to be stored or supported by a carrier. Operation 1312 attaches or detaches a number of stackable carriers from an existing carrier to form an integrated carrier or to form a stackable carrier. For example, a stackable carrier is detached from an integrated carrier to form two stackable carriers. Or a stackable carrier is attached to another stackable carrier or an integrated carrier to form an integrated carrier. In general, detaching a carrier from an integrated carrier decreases the capacity of the existing carrier, and attaching a carrier to an existing carrier increases its capacity.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

What is claimed is:

1. A side-by-side stackable carrier for a plurality of substrates, wherein the side-by-side stackable carrier is configured for use in a semiconductor fabrication facility, the side-by-side stackable carrier comprising:

two side structures comprising slot marks for holding substrates;

two end structures securing to the side structures, at least one of the end structures comprising a bidirectional attaching mechanism including mating features configured to mate with an end structure of another side-by-side stackable carrier such that the bidirectional attaching mechanism engages sequentially in a first direction and in a subsequent second direction arranged at an angle relative to the first direction, wherein the sequential engagement in the second direction subsequent to the engagement in the first direction locks engagement between the mating features, wherein the bidirectional attaching mechanisms of two mated end structures are configured to be mated by themselves without an additional component.

2. A carrier as in claim 1 wherein the bidirectional attaching mechanisms are mating/mated symmetrically to enable mating of two carriers having identical end structures.

3. A carrier as in claim 2 wherein the two carriers have the bidirectional attaching mechanism at a same end so that one carrier is rotated 180 degrees before mating with the other carrier.

4. A carrier as in claim 1 wherein the end structure opposite the end structure having the bidirectional attaching mechanism does not have any mating structure, so that only two carriers can be mated to each other.

5. A carrier as in claim 1 wherein the end structure opposite the end structure having the bidirectional attaching mechanism also has an attaching mechanism, so that more than two carriers can be mated to each other.

6. A carrier as in claim 1 wherein the bidirectional attaching mechanism comprises pins and matching holes.

7. A carrier as in claim 1 wherein the bidirectional attaching mechanism comprises a holding mechanism for slide locking with the end structure of another side-by-side stackable carrier.

8. A carrier as in claim 7 wherein the holding mechanism for slide locking comprises one of a rotation, a vertical slide, and a horizontal slide.

9. A carrier as in claim 1 wherein the bidirectional attaching mechanism comprises a locking mechanism to prevent disengaging.

10. A carrier as in claim 1 wherein the side structure comprises an L shape having one side partially covering a side of the carrier and one side partially covering a bottom of the carrier.

11. A carrier as in claim 1 wherein the side structures only cover the sides of the carrier, and the carrier further comprises a bottom structure for supporting the substrates at a bottom of the carrier.

12. A carrier as in claim 11 wherein the bottom structure comprises one or more rods having slot marks.

13. A carrier as in claim 1 wherein the side structures comprise one or more rods having slot marks.

14. A side-stacked composite carrier comprising two or more side-by-side stackable carriers mated together, each side-by-side stackable carrier comprising:

two side structures comprising slot marks for holding substrates;

two end structures secured to the side structures, one of the end structures comprising an attaching mechanism to mate with another end structure, wherein at least two side-by-side stackable carriers comprises side structures having different numbers of slot marks, each slot mark having a predetermined size common for each slot mark of the different number of slot marks, the different numbers of slot marks each defining different capacities of each corresponding at least two side-by-side stackable carriers, for holding different numbers of substrates so that the respective capacity of one of the at least two side-by-side stackable carriers corresponds to a substrate batch size within a semiconductor fabrication process and another respective capacity of another of the at least two side-by-side stackable carriers includes another different capacity corresponding to a different substrate batch size within the semiconductor fabrication process that is common to both the substrate batch size and the different substrate batch size.

15. A carrier as in claim 14 wherein the side-by-side stackable carriers have identical end structures.

16. A side-by-side stackable carrier is configured for use in a semiconductor fabrication facility, the side-by-side stackable carrier comprising:

two side structures comprising slot marks for holding substrates;

two end structures securing to the side structures, at least one of the end structures comprising a bidirectional attaching mechanism including mating features configured to mate with an end structure of another side-by-side stackable carrier such that the bidirectional attaching mechanism engages sequentially in a first direction and in a subsequent second direction arranged at an angle relative to the first direction, wherein the sequential engagement in the second direction subsequent to the engagement in the first direction locks engagement between the mating features, wherein the bidirectional attaching mechanism comprises a protruding portion and a recess portion, wherein the protruding portion is configured for slide locking with the recess portion after inserting the protruding portion into the recess portion.

17. A carrier as in claim 16 wherein the slide locking comprises one of a rotation, a vertical slide, and a horizontal slide.

18. A carrier as in claim 16 wherein the side structure comprises an L shape having one side partially covering a side of the carrier and one side partially covering a bottom of the carrier.

19. A carrier as in claim 16 further comprising a bottom structure for supporting the substrates at a bottom of the carrier, wherein the bottom structure comprises one or more rods having slot marks.

20. A carrier as in claim 16 wherein the side structures comprise one or more rods having slot marks.

* * * * *